United States Patent [19]

Oguchi

[11] Patent Number: 4,649,099
[45] Date of Patent: Mar. 10, 1987

[54] NEGATIVE-TYPE RESIST SENSITIVE TO IONIZING RADIATION

[75] Inventor: Kiyoshi Oguchi, Sayama, Japan

[73] Assignee: Dai Nippon Insatsu K.K., Tokyo, Japan

[21] Appl. No.: 757,475

[22] Filed: Jul. 22, 1985

Related U.S. Application Data

[60] Division of Ser. No. 575,545, Jan. 31, 1985, abandoned, which is a continuation-in-part of Ser. No. 432,449, Oct. 4, 1982, abandoned.

[30] Foreign Application Priority Data

Oct. 9, 1981 [JP] Japan .................. 56-161430

[51] Int. Cl.$^4$ .................. G03C 5/16; G03F 7/26
[52] U.S. Cl. .................. 430/323; 430/313; 430/325; 430/331; 430/270; 430/296; 430/942; 430/945; 430/966; 156/646; 156/643
[58] Field of Search .............. 430/313, 323, 325, 331, 430/270, 296, 942, 945, 966; 156/646, 643

[56] References Cited

FOREIGN PATENT DOCUMENTS

| | | | |
|---|---|---|---|
| 0077057 | 4/1983 | European Pat. Off. .............. | 525/61 |
| 0022598 | 2/1977 | Japan .................. | 430/323 |
| 53-9896 | 1/1978 | Japan . | |
| 0054227 | 3/1984 | Japan .................. | 430/323 |
| 745708 | 2/1956 | United Kingdom .............. | 430/323 |

OTHER PUBLICATIONS

C. T. Hu, "Photoresist Mask for Sputter Etching", *IBM Technical Disclosure Bulletin*, vol. 21, No. 3, Aug. 1978, p. 1199.

*Glycol–Ethers*, Union Carbide Corporation, Chemical Division, 270 Park Avenue, New York, N.Y., 12 pages.

*Primary Examiner*—John E. Kittle
*Assistant Examiner*—Cynthia Hamilton
*Attorney, Agent, or Firm*—Stevens, Davis, Miller & Mosher

[57] ABSTRACT

An acetalized polyvinyl alcohol having a molecular weight of 10,000 to 1,000,000 represented by the formula

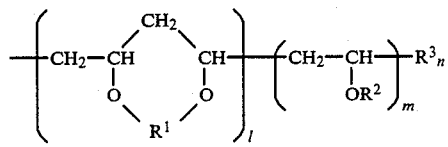

wherein: $R^1$ represents a residue of an aldehyde or a ketone the residue having no photosenitivity to ultraviolet rays; $R^2$ represents a hydrogen atom, which may partially be substituted with an acetyl group; $R^3$ represents naught or a monomeric unit copolymerizable with vinyl acetate; and l, m, n, are integers indicating polymerization degrees, has excellent characteristics such as high sensitivity, high resolving power and excellent dry etching resistance and is suitable as a negative-type resist in ionizing radiation lithography.

3 Claims, No Drawings

NEGATIVE-TYPE RESIST SENSITIVE TO IONIZING RADIATION

This is a division of application Ser. No. 575,545 filed Jan. 31, 1985, now abandoned, which in turn is a continuation-in-part application of Ser. No. 432,449 filed Oct. 4, 1982, now abandoned.

TECHNICAL FIELD

This invention relates to a resist material suitable for fine pattern formation to be used in the lithographic process during manufacture of a high-density integrated circuit such as LSI or ultra LSI, etc., or a photomask useful for production thereof. More particularly, it pertains to a novel negative-type resist material which has a high sensitivity and a high resolving power with respect to ionizing radiation and can produce a resist film of excellent etching resistance after hardening.

BACKGROUND ART

As is well known in the art, the demand for higher performance as well as higher degree of integration of semiconductor integrated circuits is ever increasing in recent years. For this reason, as a lithographic technique, in place of the photolithography employing ultra-violet rays of the prior art, efforts have been made to establish an ultra-fine pattern working technique by the use of ionizing radiation of higher energy with shorter wavelength, namely, an electron beam, soft X-rays, an ion beam, etc.

On the other hand, for enabling an ultra-fine lithography by such a change of radiation source, the resist material to be used must have corresponding characteristics. Generally speaking, the resist material to be used in ultra-fine lithography with the use of high energy ionizing radiation is required to have the following characteristics:

(a) High sensitivity to the ionizing radiation;
(b) High resolving power;
(c) Capability of forming a uniform thin film;
(d) Excellent resistance to dry etching so that dry etching which is essential for high density micropatternization may be applicable; and
(e) Excellent developing characteristics.

In the prior art, a great number of resists sensitive to ionizing radiations have been developed to be used for the above purpose. These resists may be classified into the positive-type in which the irradiated portion disintegrates to be solubilized by irradiation of an ionizing radiation and the negative-type in which the irradiated portion undergoes crosslinking to be insolubilized by irradiation of an ionizing radiation.

Of these, the positive-type resists entail difficulty in selection of developers because generally a narrow scope of developers has characteristics adapted therefor and also suffer from the drawback of weak resistance to dry etching. In contrast, most of the negative-type resists are superior in these respects to the positive-type ones.

Representative of the negative-type resists developed in the prior art are the polyglycidyl methacrylate type, glycidyl methacrylate-ethyl acrylate copolymer type, and unsaturated carboxylic acid-methacrylate copolymer type. However, these negative-type resists have some drawbacks in practical application and cannot be said to be satisfactory. For example, a glycidyl methacrylate type resist, while having high sensitivity, has a low resolution, practically as low as only about 2.0 μm, due to generation of a large amount of scum at the brim portions of the drawn image pattern. Moreover, each of the above resists has low dry etching resistance (with too much or too fast reduction in film thickness during dry etching) and therefore has a disadvantage in that it is difficult to apply thereto a dry etching process, which is indispensable for high-density micropatternization.

SUMMARY OF THE INVENTION

In view of the state of the art as described above, an object of the present invention is to provide a novel negative-type resist sensitive to ionizing radiation which has high sensitivity and excellent dry etching resistance and is also capable of attaining a high degree of resolution.

Thus, the present invention, according to a principal aspect thereof, provides a negative-type resist sensitive to ionizing radiation which comprises an acetalized polyvinyl alcohol polymer having a molecular weight of 10,000 to 1,000,000 represented by the formula:

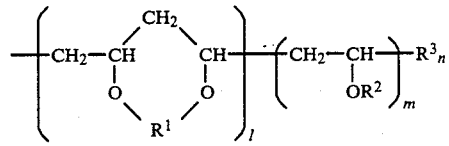

wherein $R^1$ represents a residue of an aldehyde or a ketone, the residue having no photosensitivity to ultraviolet rays; $R^2$ a hydrogen atom, which may be partially substituted by an acetyl group; $R^3$ naught or a monomeric unit copolymerizable with vinyl acetate; l, m, n integers indicating polymerization degrees.

The acetalized polyvinyl alcohol polymer constituting the resist of the present invention is known as to its structure or preparation method per se, for example, as a modified vinylon or its preparation method. However, utilization as a crosslinked resin thereof, especially for providing a resist film of excellent dry etching resistance by crosslinking by irradiation of an ionizing radiation is not known.

The present invention, according to another aspect thereof, provides an ionizing radiation lithography in which the above mentioned resist of the invention is used.

The nature, utility, and further features of this invention will be more clearly apparent from the following detailed description beginning with a consideration of general aspects of the invention and concluding with specific examples of practice thereof.

The terms "%" and "part" used hereinafter in connection with compositions are by weight unless otherwise specified.

The terms "ionizing radiation" used herein means an electron beam, an ion beam and X rays.

DETAILED DESCRIPTION OF THE INVENTION

The group $R^1$ included in the acetalized moiety in the acetalized polyvinyl alcohol polymer represented by the above formula is a residue derived from an aldehyde or ketone during acetalization occurring between the aldehyde or ketone and an alcohol. The residue has no photosensitivity to ultraviolet rays.

The term "acetalization" mentioned in the present specification is intended to be inclusive also of dehydrating condensation between a ketone and an alcohol (so called ketal formation) in addition to the acetalization in the narrow sense of dehydrating condensation between an aldehyde and an alcohol.

Typical examples of such a group $R^1$ may include aliphatic hydrocarbon groups derived from an aldehyde such as

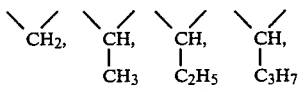

and also aromatic hydrocarbon groups such as

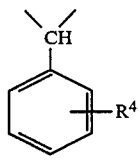

(wherein $R^4$ is hydrogen or a substituent other than hydrogen). Examples of the group $R^1$ derived from a ketone include the above mentioned groups derived from an aldehyde in which the hydrogen attached to the carbon precipitating in the ether bonding is replaced by a mono-valent aliphatic hydrocarbon or by a substituted or unsubstituted aromatic group, and a group derived from a cyclic ketone of the following formula:

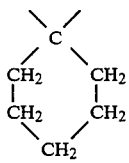

Among these, in order to obtain a resist film, it is preferred to use a group including a cyclic structure, especially an aromatic ring.

Preparation of the above acetalized polyvinyl alcohol polymer can be carried out according to a known reaction. Thus, as briefly referred to in the description of the above group $R^1$, it can be obtained by acetalization of polyvinyl alcohol with an aldehyde or a ketone in a homogeneous system or an inhomogeneous system, in the presence of, for example, an acid such as hydrochloric acid or sulfuric acid or a salt thereof. Alternatively, the acetalized polyvinyl alcohol polymer can also be obtained from polyvinyl acetate or a partially saponified product thereof as the starting material, by allowing deacetylation and acetalization to proceed simultaneously in a similar system. Further, it is also possible to carry out acetalization between an aldehyde or a ketone and a copolymer of vinyl acetate with a monomer copolymerizable with vinyl acetate such as ethylene or styrene in place of polyvinyl alcohol or polyvinyl acetate.

Thus, an acetalized polyvinyl alcohol polymer as represented by the above formula can be obtained.

As can be understood from the above description, groups represented by $R^2$ are ordinarily H (hydrogens), but a part of them may be an acetyl group ($CH_3CO$) derived from polyvinyl acetate. The group $R^3$ represents naught or polymeric units of ethylene, styrene, etc. Also, as is apparent from the preparation steps, the acetalized polyvinyl alcohol polymer is generally a random copolymer, and the expression by the above formula does not necessarily mean the bonding mode of a block copolymer.

The acetalized polyvinyl alcohol polymer as a whole has a molecular weight in the range of from 10,000 to 1,000,000. In general, the sensitivity becomes higher as the molecular weight increases, but the coating characteristics are impaired at an excessively high molecular weight. For affording suitable characteristics as an ionization radiation resist such as desirable sensitivity and etching resistance, the mole content of the acetalized moiety, namely $l/(l+m+n)$ is preferably 20 to 85%, particularly 20 to 80%. When the vinyl alcohol polymer units are represented by $m_1$ and the vinyl acetate polymer units by $m_2$ ($m_1+m_2=m$), the vinyl alcohol polymer units content, namely $m_1/(l+m+n)$ is preferably 10 to 70 mole%, the vinyl acetate polymer units content, namely, $m_2/(l+m+n)$, being 40 mole% or less, the other polymeric units content, namely, $n/(l+m+n)$, being 20 mole% or less.

The resist of the present invention is preferably constituted by the above acetalized polyvinyl alcohol polymer alone, but it may also be constituted, if desired, by a mixture of the polymer with other polymers highly compatible with the polymer and having good solubility in solvents. Examples of such polymers include polyvinyl acetate, polyvinyl alcohol (inclusive of partially saponified polyvinyl acetate), ethylene/vinyl acetate copolymer and partially saponified products thereof, and styrene/vinyl acetate copolymer and partially saponified products thereof. When used as a mixture, the acetalized polyvinyl alcohol polymer represented by the above formula is used preferably in a proportion of 50% by weight or more based on the total weight with the other polymers.

Now, the lithographic process with the use of the resist of the present invention will be described below.

First, the resist of the present invention is dissolved in one or a mixture of solvents selected from aromatic solvents such as benzene, xylene, and chlorobenzene; ketone type solvents such as acetone and methyl ethyl ketone; chlorine-containing solvents such as chloroform and ethylene chloride; and Cellosolve (which is a trademark of Union Carbide Co. for ethylene glycol ether) type solvents such as methyl Cellosolve, ethyl Cellosolve, and ethyl Cellosolve acetate, to prepare about 5 to 15% solution having a viscosity suitable for coating.

The resist solution is applied uniformly in a conventional manner by spinner coating, etc. on a semiconductor substrate or a mask substrate (blank) to be treated. Examples of appropriate semiconductor substrate include silicon substrates optionally covered with a thin layer of silicon dioxide, silicon nitride, polysilicon or aluminum. Examples of appropriate mask substrates (blanks) include a single-layer chromium (Cr) mask blank, two- or three-layer chromium maskblank with one or both surfaces of low reflection, see-through type mask blank comprising (i) a compound of silicon and silicon oxide or (ii) ferric oxide, single layer tantalum (Ta) mask blank, and two- or three-layer tantalum mask blank with low surface reflection and conductive mask blanks comprising an additional transparent electroconductive layer along with the above mentioned masking layers (such as Cr, Ta and silicon compound layers).

The thus coated substrate is then subjected to a prebake treatment, to form a resist film or a thickness of about 0.1-2 μm. The pre-bake conditions differ depending on the solvent employed. In general, a temperature of 70°-90° C. and a time of 20 to 40 minutes are suitable in case of lower alcohols.

Subsequently, at the desired portions of the resist film, an ionizing radiation such as an electron beam or soft X-ray is applied to accomplish pattern drawing, followed further by treatment with a developer to dissolve away selectively the unirradiated portions, thereby forming a resist pattern. As the developer, solvents similar to those used for preparation of resist solutions as described above are preferably employed. The thus formed resist pattern is preferably rinsed, for example, with a lower alcohol.

The substrate having the resist pattern after development may be subjected to post-bake treatment and scum elimination treatment, as desired, and thereafter subjected to etching to form an etching pattern at the exposed portion of the substrate. The post-bake treatment may be conducted, for example, at a temperature of 120°-140° C. for 20-40 minutes. On the other hand, the scum elimination treatment can be conducted, for example, with the use of an oxygen plasma under the conditions of a pressure of 0.9-1 Torr and an output of 100 W for 1-2 minutes.

For etching, either wet etching or dry etching may be applicable, but dry etching suitable for micropatternization is desirable for working of a semiconductor substrate or a mask substrate of high integration degree. In this regard, a crosslinked resist film of particularly excellent etching resistance can be produced by incorporation of benzene rings into the molecular structure of the acetalized polyvinyl alcohol to be used in the present invention. For example, when the patternized film of the thus prepared resist of the present invention is formed on a chromium mask substrate and subjected to dry etching at the exposed chromium portion with a chlorine-containing gas such as carbon tetrachloride, the film reduction speed of the resist film is equal to the value of the photoresist of a novolac type phenol resin which has very excellent dry etching resistance.

The etching conditions are basically known for respective semiconductor or mask substrates to be processed. Examples of etchants to be used in combination with the resist of the invention include dry etchants such as carbon tetrachloride (suitable for Cr masks and Al films), carbon tetrafluoride (for Ta masks, $SiO_2$ films, $Si_3N_4$ and poly-Si films), these gases being used together with a minor amount of oxygen, as desired, and wet etchants such as $(NH_4)_2Ce(NO_3)_6$ dissolved in dilute perchloric acid (for Cr masks) and $AgNO_3+NH_4F$ dissolved in dilute nitric acid (for $Si+SiO_2$ compound films).

After etching, the resist pattern is removed by peeling off or burning with an oxygen plasma. Thus, one cycle of the lithographic steps is completed.

As described above, according to the present invention, there is provided a negative-type resist sensitive to ionizing radiation which is highly practical and suitable for production of a highly integrated semiconductor circuit or photomask for which dry etching is essentially required for micropatternization, because it has high sensitivity as well as high resolving power and also has excellent dry etching resistance.

In order to indicate fully the nature and utility of this invention, the following examples are set forth, it being understood that these examples are presented as illustrative only and are not intended to limit the scope of the invention.

EXAMPLE 1

A polyvinyl alcohol (10 g) having a polymerization degree of 1,500 and 150 g (1.4 mole) of benzaldehyde were added to 1,000 cm³ of a solvent mixture of 5:2 (weight ratio) of ethylene chloride and methanol. This step was followed further by addition of 2-3 drops of hydrochloric acid, and the reaction was carried out under stirring at 45° C. for 40 hours. Then, the reaction mixture was placed into methanol, and the precipitated polymer was dissolved in benzene. The polymer was purified by re-precipitation with a solvent mixture of methanol and benzene to obtain an acetalized polyvinyl alcohol of the following formula in a yield of 90%.

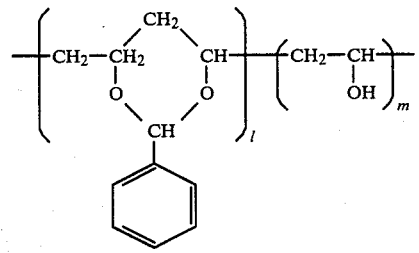

The above polymer had a viscosity of 160 cm³/g in a benzene solution (0.1 g/10 cc, 30° C.), from which its molecular weight was estimated to be about 110,000. The acetalization percentage $l/(l+m)$ was also found to be about 70 mole %.

The above polymer was dissolved in benzene and filtered through a 0.2 μm filter to obtain a resist solution of 5% concentration.

The resist solution was applied on a chromium mask substrate (blank) by the spinner coating method and prebaked at 90° C. for 30 minutes to obtain a uniform resist film of a thickness of 6,000 Å. Then, on the resist film, an electron beam of a beam radius of 0.25 μm and an energy of 10 KeV was projected in a dose of $2 \times 10^{-6}$ coulomb/cm² to carry out pattern drawing thereon. Further, the resist film was developed by treatment with benzene for one minute, followed by washing with isopropyl alcohol for one minute, to form a resist pattern.

As the next step, the substrate having the resist pattern obtained was post-baked at 140° C. for 30 minutes and thereafter subjected to the scum elimination treatment with an oxygen plasma of a pressure of 1 Torr and an output of 100 W for one minute. The substrate was then subjected to etching at the exposed portion of the chromium film according to the reactive sputter etching method with a gas mixture of $CCl_4$ and $O_2$ under a pressure of $3 \times 10^{-1}$ Torr and an output of 300 W for 5 minutes. The film reduction speed of the resist pattern was found to be 200 Å/min., thus indicating sufficient dry etching resistance.

After etching, the substrate was immersed in a film-peeling solution of a sulfuric acid-hydrogen peroxide mixture at 70° C. for 5 minutes, and thereafter the resist pattern film was peeled off to obtain a photomask having a chromium pattern comprising 2 μm lines and spaces.

EXAMPLE 2

With the use of the same mole (67 g) of acetaldehyde in place of benzaldehyde and the use of a solvent mixture of 7:1 of methanol and water, acetalization of the same polyvinyl alcohol as that used in Example 1 was carried out at 40° C. for 15 hours. The reaction product was filtered and purified similarly as in Example 1 to obtain a polymer of the following formula in a yield of 80%.

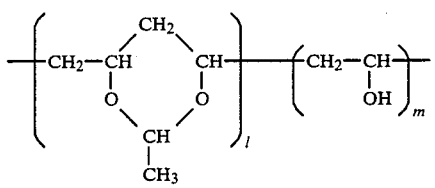

The above polymer had a viscosity of 210 cm$^3$/g in 0.1 g/10 cc methyl Cellosolve solution at 30° C. The estimated molecular weight was 76,000, and the acetalization percentage about 68 mole %.

The above polymer was dissolved in methyl Cellosolve and filtered to obtain a resist solution of 5% concentration.

The resist solution was applied on a wafer having a silicon oxide film by the spinner coating method and pre-baked at 80° C. for 30 minutes to form a uniform resist film of a thickness of 1 μm. Then, the resist film was irradiated with an electron beam of an energy of 10 KeV in a dose of $6 \times 10^{-6}$/cm$^2$ and developed with methyl Cellosolve, which step was followed by rinsing with isopropyl alcohol to form a resist pattern.

Subsequently, after performing the post-bake treatment and the scum elimination treatment similarly as in Example 1, wet etching was carried out with a mixed aqueous solution of hydrofluoric acid and ammonium fluoride and the resist film was peeled off to prepare a wafer having a patternized silicon oxide film.

EXAMPLE 3

With the use of the same mole (130 g) of trimethylsiloxycyclohexane synthesized from cyclohexanone in place of benzaldehyde, after addition of 2-3 drops of hydrochloric acid in dimethyl sulfoxide, the polyvinyl alcohol as used in Example 1 was acetalized at 50° C. for 15 hours to obtain a polymer of the following formula in a yield of 95%.

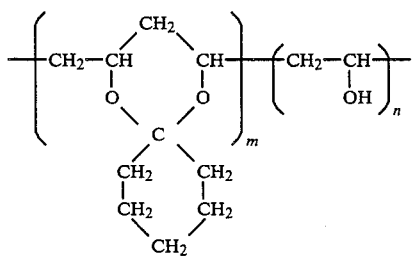

The above polymer had a viscosity of 180 cm$^3$/g in methyl Cellosolve solution (0.1 g/10 cm$^3$, 30° C.), the estimated molecular weight being about 89,000 and the acetalization percentage being about 42 mole %.

The polymer was dissolved in methyl Cellosolve to obtain a 5% resist solution, which was in turn coated and dried. The resist film obtained of a thickness of 0.6 μm was subjected to pattern irradiation by an electron beam of 10 KeV and developed with methyl cellosolve. As the result, it exhibited a sensitivity (dose when the residual film percentage after resist development is 50%) of $4 \times 10^{-6}$ coulomb/cm$^2$.

EXAMPLE 4

With the use of a saponified product of ethylene/vinyl acetate copolymer (vinyl acetate content: 80%) having a polymerization degree of 1,000 and acetaldehyde, acetalization was conducted by following substantially the same procedure as in Example 2, to obtain an acetalized polymer. The acetalization percentage was 40%, and the polymer had a viscosity of 150 cm$^3$/g in 0.1 g/10 cm$^3$ methyl cellosolve solution at 30° C., the estimated molecular weight being about 90,000.

The above polymer was dissolved in methyl cellosolve to prepare an 8% resist solution, which was then applied as a coating and dried. The resist film obtained of a thickness of 0.6 μm was subjected to pattern irradiation by an electron beam of 10 KeV and developed with methyl Cellosolve to exhibit a sensitivity of $8 \times 10^{-6}$ coulomb/cm$^2$.

EXAMPLE 5

Into one liter of a 10.5% methanolic solution of a polyvinyl acetate having a polymerization degree of 1,000, 0.5 mole of sulfuric acid was added and deacetylation (saponification) was carried out by heating at 60° C. for 40 minutes. Immediately before the mixture became turbid, acetaldehyde was added in a quantity of two equivalents of polyvinyl acetate, and the reaction was carried out at 60° C. for one hour. The reaction product was precipitated by adding it into benzene, the precipitate was dissolved in acetone and the polymer was re-precipitated with a solvent mixture of methanol and benzene to obtain a polymer of the following formula:

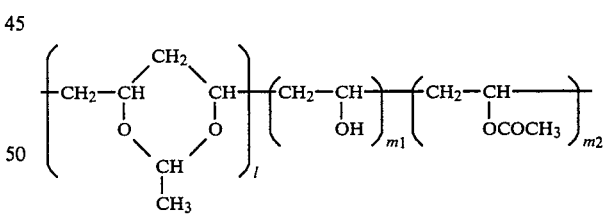

The above polymer had a solution viscosity in methyl Cellosolve of 180 cm$^3$/g (0.1 g/10 cm$^3$, 30° C.), the acetalization percentage (l/(l+m+n)) being 25 mole % and the acetyl percentage (m$_2$/(l+m$_1$+m$_2$)) being 38 mole %.

The sensitivity measurement was carried out similarly as in Example 3 with the use of a resist solution comprising a 5% methyl Cellosolve solution of the above polymer. As a result, the resist film exhibited a sensitivity of $6 \times 10^{-6}$ coulomb/cm$^2$.

EXAMPLE 6

Two parts of the acetalized polyvinyl alcohol synthesized in Example 1 and one part of a polyvinyl acetate having a polymerization degree of 1,000 were dissolved in chloroform and thoroughly mixed to obtain a resist solution of 6% concentration. The polymeric mixture obtained separately by precipitation and purification was found to have a solution viscosity of 150 cm$^3$/g (30° C., 0.1 g/10 cc sulfuric acid solution).

Sensitivity measurement was conducted with the use of the above resist solution and chloroform as developer, by following otherwise the same procedure as in Example 3. As a result, the resist film was found to exhibit a sensitivity of $3\times10^{-6}$ coulomb/cm$^2$.

What is claimed is:

1. An ionizing radiation lithography process, which comprises forming on a substrate a thin film of a resist comprising an acetalized polyvinyl alcohol polymer having a molecular weight of 10,000 to 1,000,000 represented by the formula:

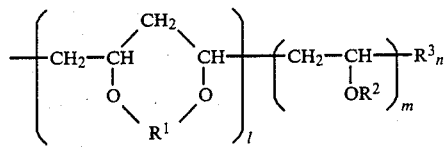

wherein:

$R^1$ represents a residue of an aldehyde or a ketone, the residue having no photosensitivity to ultraviolet rays;

$R^2$ represents a hydrogen atom, which may partially be substituted with an acetyl group;

$R^3$ represents naught or a monomeric unit copolymerizable with vinyl acetate; and l, m, n are integers indicating polymerization degrees, subjecting the thin film of said resist to imagewise irradiation by ionizing radiation, dissolving away selectively the non-irradiated portions of the resist film to expose corresponding portions of the substrate, and etching selectively the exposed portions of the substrate.

2. An ionizing lithography process according to claim 1, wherein the non-irradiated portion is dissolved selectively with a solvent selected from the group consisting of aromatic hydrocarbons, chlorinated hydrocarbons, ethylene glycol ethers, lower alcohols and mixtures thereof.

3. An ionizing lithography process according to claim 1, wherein etching is carried out with the use of a gaseous etchant comprising a carbon halide gas selected from the group consisting of carbon tetrachloride gas, carbon tetrafluoride gas and a mixture of said carbon halide gas with oxygen.

* * * * *